(12) United States Patent  
Tanaya et al.

(10) Patent No.: US 7,592,741 B2  
(45) Date of Patent: Sep. 22, 2009

(54) PIEZOELECTRIC DEVICE

(75) Inventors: Hideo Tanaya, Suwa (JP); Katsumi Kuroda, Minowa (JP); Kazuya Hirasawa, Tatsuno (JP)

(73) Assignee: Epson Toyocom Corporation (JP)

( * ) Notice: Subject to any disclaimer, the term of this patent is extended or adjusted under 35 U.S.C. 154(b) by 0 days.

(21) Appl. No.: 11/935,661

(22) Filed: Nov. 6, 2007

(65) Prior Publication Data

US 2008/0106172 A1  May 8, 2008

(30) Foreign Application Priority Data

Nov. 7, 2006  (JP) .............................. 2006-301225

(51) Int. Cl.  
*H03H 9/145* (2006.01)  
*H01L 41/04* (2006.01)  
(52) U.S. Cl. ..................................... 310/370  
(58) Field of Classification Search ............... 310/370  
See application file for complete search history.

(56) References Cited

U.S. PATENT DOCUMENTS

| | | | | |
|---|---|---|---|---|
| 3,969,640 | A * | 7/1976 | Staudte | 310/312 |
| 6,541,897 | B2 * | 4/2003 | Endoh | 310/344 |
| 6,924,582 | B2 * | 8/2005 | Shimizu et al. | 310/312 |
| 7,205,708 | B2 * | 4/2007 | Yamada | 310/370 |
| 7,279,824 | B2 * | 10/2007 | Tanaya et al. | 310/344 |
| 7,342,352 | B2 * | 3/2008 | Kawashima | 310/370 |
| 2001/0022488 | A1 * | 9/2001 | Kawauchi et al. | 310/348 |
| 2003/0168943 | A1 | 9/2003 | Matsuyama et al. | |
| 2005/0062368 | A1 * | 3/2005 | Hirasawa et al. | 310/370 |

(Continued)

FOREIGN PATENT DOCUMENTS

JP  2002-261575  9/2002

(Continued)

*Primary Examiner*—J. A San Martin  
(74) *Attorney, Agent, or Firm*—Harness, Dickey & Pierce, P.L.C.

(57) ABSTRACT

A piezoelectric device comprises: a piezoelectric resonator element having a base, a plurality of oscillating arms paralleled each other and extended from the base, a plurality of supporting arms extended from the base and in parallel with the side surface of each of the plurality of oscillating arms so as to sandwich the plurality of oscillating arms, a groove formed in at least one of a front surface and a back surface of each of the plurality of oscillating arms and an end weight layer formed in at least one of the front surface and the back surface near to an end portion of each of the plurality of oscillating arms; a package storing the piezoelectric resonator element within a containable recess and being air-tightly sealed by a lid; a bottom surface recess rimmed in the bottom surface of the containable recess; and a connecting pad formed as a protrusion in an region that is connected with the plurality of supporting arms in the bottom surface of the containable recess. A part of the plurality of supporting arms is connected to the connecting pad via a joint portion. The bottom surface recess includes an edge in a region of the bottom surface of the containable recess opposing a part of the plurality of oscillating arms between the groove and the end weight layer, and the edge rims the bottom surface recess so as to allocate a part of the bottom surface of the containable recess opposing the end weight layer inside of the edge.

8 Claims, 7 Drawing Sheets

U.S. PATENT DOCUMENTS

| | | | |
|---|---|---|---|
| 2005/0116586 A1* | 6/2005 | Tanaya et al. | 310/348 |
| 2007/0024163 A1* | 2/2007 | Tanaya | 310/370 |
| 2007/0159029 A1* | 7/2007 | Aratake | 310/370 |

FOREIGN PATENT DOCUMENTS

| | | |
|---|---|---|
| JP | 2002-359536 | 12/2002 |
| JP | 2003-060470 | 2/2003 |
| JP | 2003-133883 | 5/2003 |
| JP | 2004-297198 | 10/2004 |
| JP | 2004-357178 | 12/2004 |
| JP | 2005-102138 | 4/2005 |
| JP | 2006-203458 | 8/2006 |

* cited by examiner

PIEZOELECTRIC DEVICE

BACKGROUND OF THE INVENTION

1. Technical Field

The present invention relates to a piezoelectric device including a piezoelectric resonator element such as quartz stored in a package, in particular, a supporting unit for the piezoelectric resonator element.

2. Related Art

Figure 11:
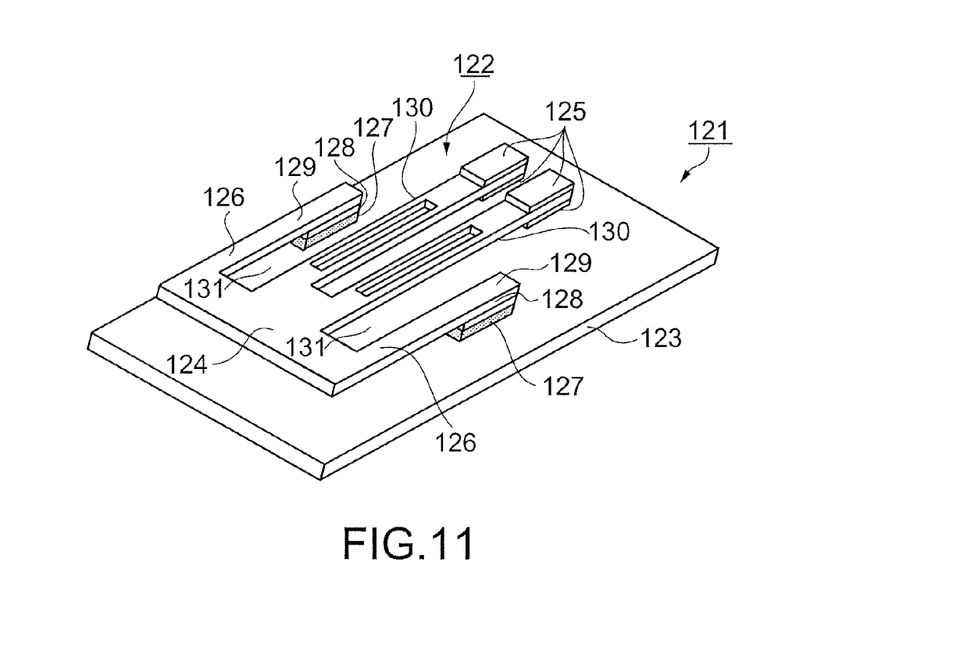
FIG. 11 is a perspective view showing a conventional quartz resonator element.

A piezoelectric device such as a quartz resonator including a quartz resonator as a piezoelectric resonator element is widely used for mobile phones and IC cards (See JP-A-2004-35781 and 2004-297198, for examples.) FIG. 11 shows a conventional piezoelectric device for explanation. FIG. 11 is a perspective view of a structure of a conventional piezoelectric element. As shown in the figure, a quartz resonator 121 as an example of the conventional piezoelectric device comprises a connecting electrode 127 formed on a base substrate 123 and a quartz resonator element 122 connected to the electrode via a conductive adhesive 128. The quartz resonator element 122 comprises a pair of oscillating arms 130, a pair of supporting arms 126 and a base 124 connecting oscillating arms 130 and supporting arms 126, which are integrally formed. Oscillating arms 130 having almost the same configuration are extended in parallel with each other from the end of the base 124. A groove 131 is formed both on the front and back surfaces of oscillating arms 130 to improve an oscillating property (see JP-A-2002-261575 for example.) Further, an end weight layer 125 for arranging a frequency is formed both on the front and back surfaces of oscillating arms 130. A connecting electrode 127 is formed on a base substrate 123 to have a step against the upper surface of the base substrate 123 and supporting arms 126 are located on the connecting electrode 127 and connected via the conductive adhesive 128. This connection yields a space between the upper surface of the base substrate 123 and the quartz resonator 122.

In the quartz resonator element 122, an adhesive material that is under high viscosity is coated on the connecting electrode 127. Supporting arms 126 are placed on the adhesive material and connected to the connecting electrode 127 by hardening of the adhesive material. Here, when the quartz resonator element having the conventional size (the length 2400 µm, the width 500 µm and the thickness 100 µm) is connected, the central gravity of the quartz resonator element 122 of which a part is located on the conductive adhesive 128 is sunk with respect to the length of oscillating arms 130. As a result of it, the base side or the end side of the quartz resonator element 122 is near to the base substrate 123. In order to avoid this accession, the joint positions of supporting arms 126 are set around the central gravity of the quartz resonator element 122 with respect to the length direction of the oscillating arms 130, for example (see JP-A-2004-2971798.)

The conventional quartz element 121, however, has a disadvantage in that the quartz resonator element 122 is deformed while supporting arms 126 work as a fulcrum, when excessive shock such as falling down is applied to the vertical direction of the element 121, making the edge of the end weight layer 125, which is the most far from the fulcrum, collide with the upper surface of the base substrate 123. This collision damages or deforms oscillating arms 130 due to the weakness of the end weight layer 125 against such shock, deteriorating an oscillating characteristic such as the mismatching of the CI value or a resonant oscillation frequency.

SUMMARY

An advantage of the present invention is to provide a piezoelectric device overcoming the above issues.

A piezoelectric device according to one aspect of the invention includes: a piezoelectric resonator element having a base, a plurality of oscillating arms paralleled each other and extended from the base, a plurality of supporting arms extended from the base and in parallel with the side surface of each of the plurality of oscillating arms so as to sandwich the plurality of oscillating arms, a groove formed in at least one of the front surface and the back surface of each of the plurality of oscillating arms and an end weight layer formed in at least one of the front surface and the back surface near to an end portion of each of the plurality of oscillating arms; a package storing the piezoelectric resonator element within a containable recess and being air-tightly sealed by a lid; a bottom recess rimmed in the bottom of the containable recess; and a connecting pad formed as a protrusion in an region that is connected with the plurality of supporting arms in the bottom surface of the containable recess. In the piezoelectric resonator element, a part of the plurality of oscillating arms is connected to the connecting pad via a joint portion. The bottom surface recess includes an edge in a region of the bottom surface of the containable recess opposing a part of the plurality of oscillating arms between the groove and the end weight layer, and the edge rims the bottom surface recess so as to allocate a part of the bottom surface of the containable recess opposing the end weight layer inside of the edge.

According to the first aspect of the invention, the quartz resonator element is deformed while the connecting portion works as a fulcrum, when a shock is applied to the piezoelectric element, making the base and the oscillating arms contact (collide) with the bottom surface of the containable recess. At this time, a contact (collision) force is spread out to the contact region of the base and the oscillating arms, as weakening such contact force. Further, at the end of the oscillating arms, the bottom recess is formed so that it passes through the region of the bottom of the containable recess opposing a part of the oscillating arms between the groove and the end weight layer and rimmed so as to o place the bottom region of the containable recess opposing the end weight layer and the above end region inside the edge. The end of oscillating arms including the deformed end weight layer goes into this bottom recess and contacts with region near to the edge of the bottom recess opposing a part of the oscillating arms between the groove and the end weight layer. In detail, one part of the oscillating arms having weak strength due to existence of the groove and the other part of the oscillating arms at the position avoiding the end weight layer generating a large frequency change by a configuration change due to the above contact, contact with the region near to the bottom recess. Hence, it is hard to damage the device even when the oscillating arms contact, making frequency hardly change. These features provide a piezoelectric device, which can avoid deterioration of its oscillating property due to the damage of a piezoelectric resonator element or the frequency change thereof even when a shock is applied to the piezoelectric device.

Further, compared with the gravitational center of the piezoelectric resonator element, the connecting portion may be preferably placed closer to the end side of the oscillating arms.

This placement provides the piezoelectric resonator element for deforming toward the base side while the connecting portion becomes a fulcrum when a shock is applied to the resonator element since the connection portion is located at the end of the end side of the oscillating arms off from the gravitational center of the piezoelectric resonator element, making the base contact with the bottom surface of the containable recess. Next, the end side is deformed, making the bottom surface of the containable recess contact (collide) with the oscillating arms. A force applied to the oscillating arms, however, is weakened since the base is already contacted and the contact reduces the force, making the resonator element hardly damaged. Accordingly, this feature further provide a piezoelectric device which can avoid deterioration of oscillating property due to the damage of the piezoelectric resonator element or the frequency change in addition to the above mentioned features.

Further, compared with the end weight layer of the piezoelectric resonator element, the connecting portion may be preferably placed closer to the base side.

This placement can avoid that a weight material is attached to the connecting portion when the end weight layer is formed by evaporation or sputtering since the connecting portion is opened with masked.

Further, the connecting portion may be preferably located within a region that is 30% or more and 50% or less of the length of the supporting arms from the end of the base opposing to the side where the oscillating arms are extended.

This allocation of the connecting portion can stabilize the stance of the piezoelectric resonator element when the supporting arms are mounted on the connecting pad since the connecting portion is positioned along its length, which is 30% or more of the supporting arms from the end of the base. Further, this location can avoid large fluctuation of the stances of the resonator element when the supporting arms are mounted on the connecting pad and the length of the connecting portion is short (less than 30%.) Further, it is possible to make the distance between the cross section of the supporting arms and the base, and the connecting portion longer since the connecting portion is positioned along the length which is 50% or less of the length of the supporting arms from the base. Such dimension can relax stress concentration at the region where the supporting arm crosses with the base when the concentration is generated at the time of applying a shock such as falling off to the piezoelectric resonator element, making it possible to avoid the damage to the piezoelectric resonator element in this region.

Further, the connecting portion may preferably be made of a softened conductive adhesive.

This material gives the connecting portion softness, absorbing a shock and relaxing the shock due to the softness when the shock is applied to the piezoelectric resonator element from the outside. The connection portion made of such material can avoid damage of the e piezoelectric resonator element when a shock is applied to it, providing a high shockproof piezoelectric device.

Further, a buffer may preferably be formed at least in a region within the bottom surface of the containable recess, opposing a part of the plurality of oscillating arms between the groove of and the end weight layer and/or at least a region opposing the base.

The buffer formed at the bottom surface of the containable recess can relax a shock due to a contact of the base and/or oscillating arms with the bottom surface of the containable recess, which is generated by deformation of the piezoelectric resonator element when a force such as a shock is applied to the resonator element.

Further, a dimension of a space between the bottom surface and the piezoelectric resonator element in the region opposing a part of the plurality of the oscillating arms between the groove and the end weight layer may preferably be different from a dimension of a space between the bottom surface and the piezoelectric resonator element in the region opposing the base.

These different dimensions between two spaces generate two separated contacts of opposing regions due to deformation of a piezoelectric resonator element when a force such as a shock is applied to the piezoelectric resonator element. These separated contacts can disperse a shock force of contact, avoiding the damage of the piezoelectric resonator element.

Further, a notch directing toward the inside of the base from the two outsides of the base may preferably be formed.

This structure can disperse a stress into the notch, while the stress is concentrated only to the oscillating arms before forming the notch at the time of receiving a shock. This forming a notch can avoid the damage of the oscillating arms due to the stress concentration at the time of receiving a shock. In addition to this advantage, this forming a notch can reduce a leak of oscillation energy of oscillation arms to supporting arms, avoiding deterioration of oscillation property and providing a piezoelectric device having a stable oscillation property.

BRIEF DESCRIPTION OF THE DRAWINGS

The invention will be described with reference to the accompanying drawings, wherein like numbers reference like elements.

FIG. 2 show a quartz oscillating element of the invention.

DESCRIPTION OF EXEMPLARY EMBODIMENTS

Figure 1:
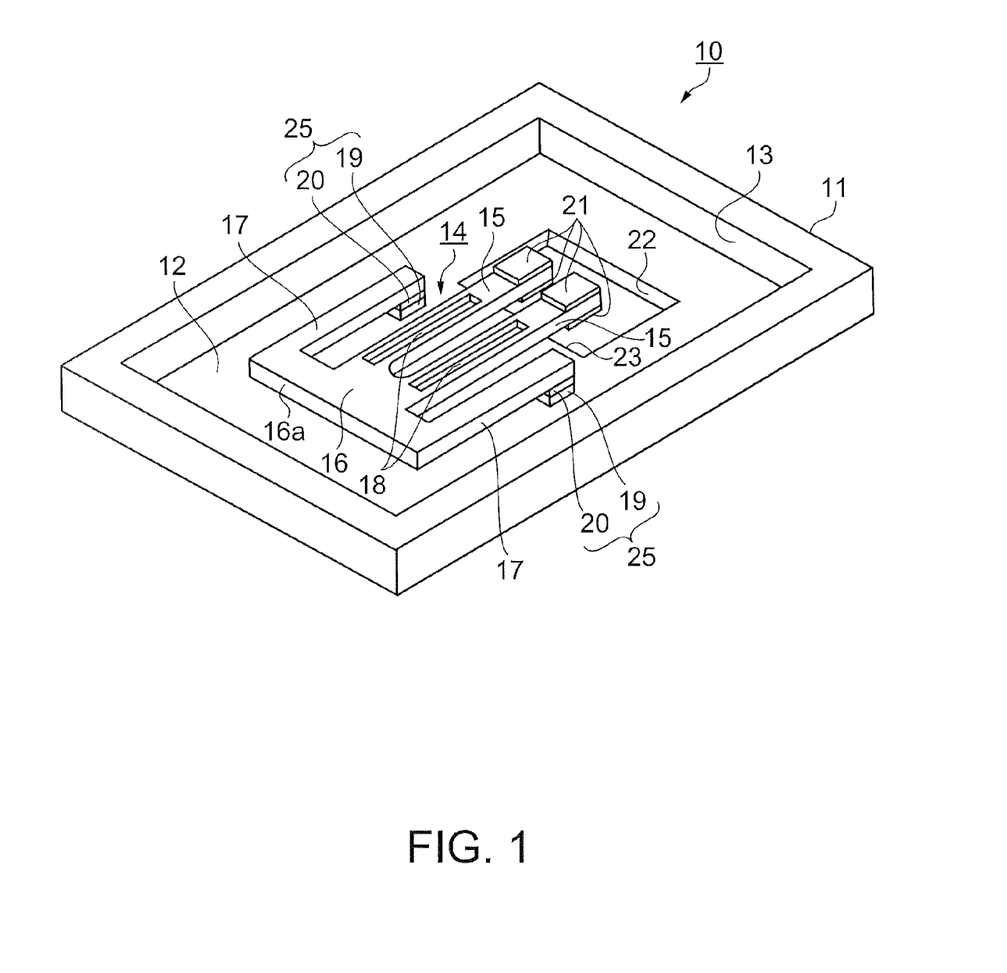
FIG. 1 is a perspective view showing a quartz resonator element as a piezoelectric device of the present invention.

Embodiments of the invention will be described as accompanied with drawings. FIGS. 1 and 2 show a quartz device according to the invention. FIG. 1 is a perspective view, FIG. 2A is a plain view FIG. 2B is a cross sectional view seen from the A-A' line.

Figure 2A:
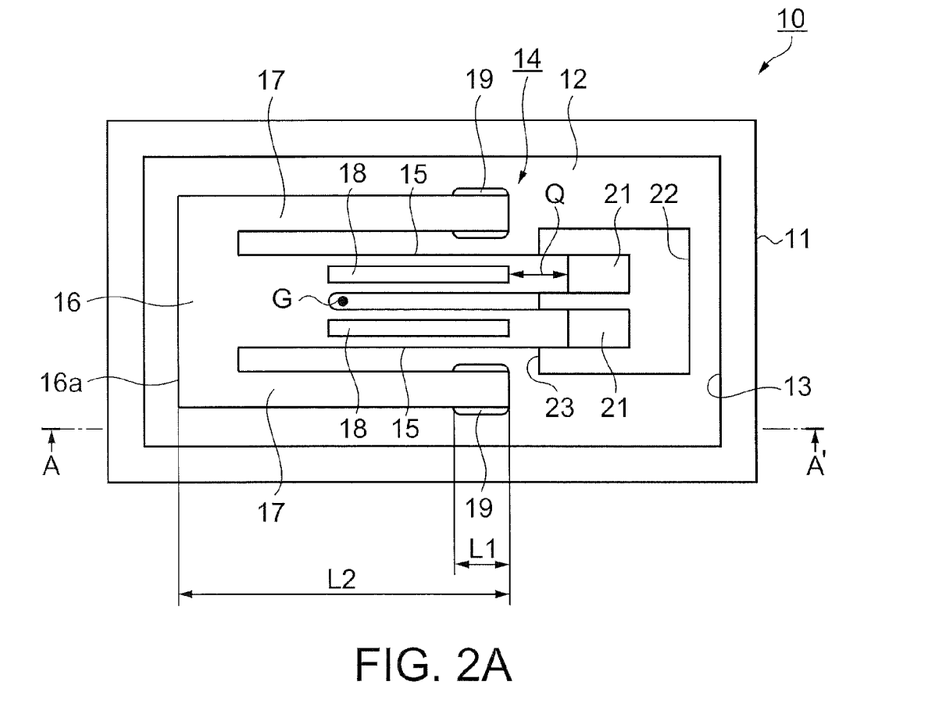
FIG. 2A is a plain view.
Figure 2B:
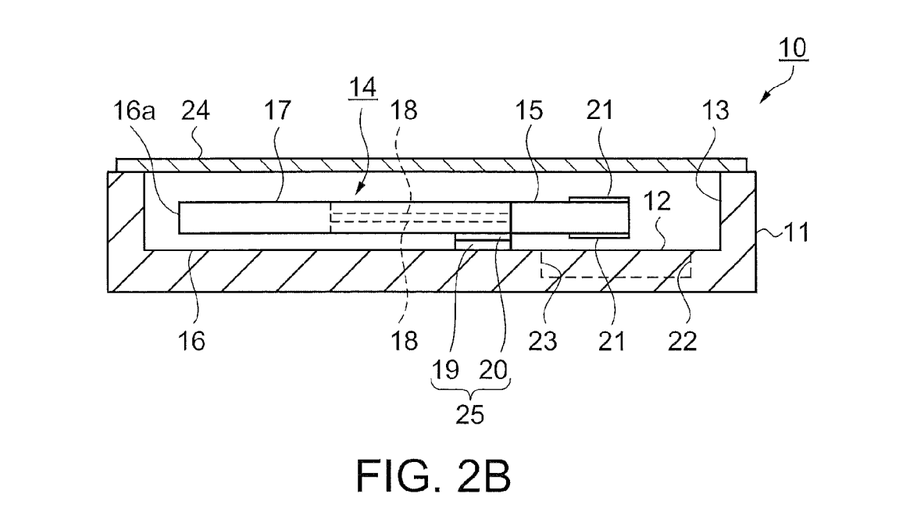
FIG. 2B is a cross sectional view seen from the line A-A' in FIG. 2B.

As shown in FIGS. 1 and 2, a quartz resonator 10 as an example of a piezoelectric resonator comprises a containable recess 13 in a package 11, a quartz resonator element 14 as an example of a piezoelectric resonator element connected to the containable recess 13 and a lid 24 (shown in FIG. 2B) that air-tightly seals the resonator element 14. Here, the lid 24 is omitted and not shown in FIG. 1 and FIG. 2A.

The package 11 is made of ceramic for example and includes the containable recess 13 having a bottom surface 12 in the center seen from a plain view. This containable recess 13 becomes a containable cavity for the quartz resonator element 14. The bottom surface 12 includes the bottom recess 22. The detail of the bottom recess 22 will be explained later. The bottom surface 12 further includes a connecting pad 19 for mounting and connecting the quartz resonator element 14. Here, the bottom surface 12 and its surrounding further includes a wiring pattern connected to the connecting pad 19, but it is omitted in the explanation. A supporting arm 17 of the quartz resonator element 14 is mounted on the upper surface of the connecting pad 19 and connected to a connecting portion 25 via a conductive adhesive 20.

The quartz resonator element 14 comprises a pair of oscillating arms 15, and a pair of supporting arms 17 which are integrally formed on a quartz substrate. The pair of oscillating arms 15 is extended from and in parallel with a base 16 and includes open ends. The plurality of supporting arms 17 region are also extended from the base 16 and in parallel with the side surface of each of the plurality of oscillating arms 15 so as to sandwich the plurality of oscillating arms 15. Parts around the open ends of the oscillating arms 15 are called as end portions of the oscillating arms 15 and parts around the open ends of the supporting arms 17 are called as end portions of the supporting arms 17. The configuration of the quartz resonator element 14 is set to generate the resonance frequency 32.768 KHz. In the embodiment, the length of the oscillating arms 15 from a base end 16a is 1.1 to 1.4 mm, the length of the supporting arms 15 from the base end 16a is 0.87 to 1.16 mm and the thickness is 0.07 to 0.13 mm. The width between the outside surfaces of the supporting arms 17, namely the width of the quartz resonator element is 0.05 to 0.15 mm. A groove 18 like a concave shape is formed from a part near to the base 16 to the central region both on the front surface and back surface of the oscillating arms 15. The groove 18 enhances the electric field efficiency of an exciting electrode (not shown in the drawing) formed on the oscillating arms 15, improving oscillating characteristics. In the embodiment, the groove 18 is formed both on the front surface and the back surface of the oscillating arms 15. But it is not limited to this structure, such as it being formed either on the front surface or the back surface. Further, an end weight layer 21 is formed both on the front and back surfaces of the oscillating arms 15. The end weight layer 21 is made of a metal such as gold (Au) or silver (Ag), for example. The end weight layer 21 has the thickness 0.1 µm to 2.0 µm and set for rough adjustment of a resonant frequency. Further, a metal film not shown in the drawing and having the thickness around 0.10 µm (made of Cr or Au) is formed between the groove 18 and the end weight layer 21 in order to finely tune a resonant frequency. The metal film works as an electrode for the quartz resonator element 14. Removing a part of the end weight layer 21 and the metal film with a laser beam tune a frequency. In the embodiment, the end weight layer 21 is formed both on the front surface and the back surface of the oscillating arms 15. But it is not limited to this structure, such as it being formed either on the front surface or the back surface.

In the quartz resonator element 14, each of the supporting arms 17 is connected to the connecting pad 19 via a conductive adhesive 20 in a connecting portion 25 and fixed to the package 11. The connecting portion 25 is placed at the edge side of the supporting arms 17 off from the gravitational center G of the quartz resonator element 14. More preferably, the end of the connecting portion 25 at the side of base is placed at the end side of the supporting arms 17 off from the gravitational center G of the quartz resonator element 14 and the end of the connecting portion 25 is placed at the base side off from the end of the base side of the end weight layer 21. This placement constrains an oscillation leakage from the oscillating arms 15 and transmission of the stress due to a shock applied to the package from the outside, to the oscillating arms 15. Such constraining removes the connecting portion 25 from the base 16 and avoids attaching of a material for the weight to the connecting portion 25 when the end weight layer 21 is formed by evaporation or sputtering. The connecting pad 19 having a predetermined thickness is formed on the bottom surface of the containable recess 13 and such thickness maintains a space between the quartz resonator element 14 and the bottom surface 12 and fixes the resonator element 14. The connecting pad is formed by metalizing tungsten (W) for example.

The conductive adhesive 20 may preferably be an adhesive having flexibility after hardening, such as a silicone conductive adhesive (the young's modulus $1 \times 10^1$ to $5 \times 10^2$ Mpa) or a polyimide conductive adhesive ((the young's modulus $1 \times 10^3$ to $1 \times 10^4$ Mpa.) This flexibility absorbs a shock from the outside, reducing a damage of the quartz resonator element 14.

The conductive adhesive 20 mostly comprises metal filler, a resin material and an organic solvent. Major compositions of a silicone conductive adhesive frequently used for a quartz resonator are a Ag filler, silicone resin and alkane such as decane. Other alkane may be used for an organic solvent. The conductive adhesive 20 is discharged to a ceramic base by a dispenser and the like and the quartz resonator element 14 is mounted on it soon after. Then, the quartz resonator element 14 is heated by a heating and hardening furnace, volatilizing a solvent and yielding a hardening and cross-linking reaction to a resin, ascertaining mechanical strength of an adhesive and maintaining its configuration. Here, the solvent is rapidly volatilized from the surface of the adhesive even before the adhesive is hardened, losing the adhesive's viscosity gradually and realizing a capability of maintaining the adhesive's configuration in some degrees. When a small sized quartz resonator element having the outside dimension such as the length 1500 µm, the width 500 µm and the thickness 100 µm is mounted on the adhesive, a capability of maintaining the configuration of the adhesive supersedes the weight of the quartz resonator element, preventing the base from bowing even if the tuning fork with a frame is mounted on the edge side off from the gravitational center and realizing a resonator element having superior characteristics.

Next, the bottom recess 22 formed in the bottom surface 12 of the containable recess 13 in the package 11 will be explained. The bottom recess 22 comprises a contact edge 23 passing through a region of the bottom surface 12 opposing a part of the oscillating arms 15 between the end weight layer 21 and the groove 18. The groove 18 is formed in the oscillating arms 15 of the quartz resonator element 14 connected to the connecting pad 19. The contact edge 23 is further extended so as to rim and form an open portion of the bottom recess 22. The open end portion has a region opposing a part of the oscillating arm 15 including the end weight layer 21 located at least at the position toward end direction from the contact edge 23. The region is allocated inside of the edge when the region is seen from the plain view.

Figure 3A:
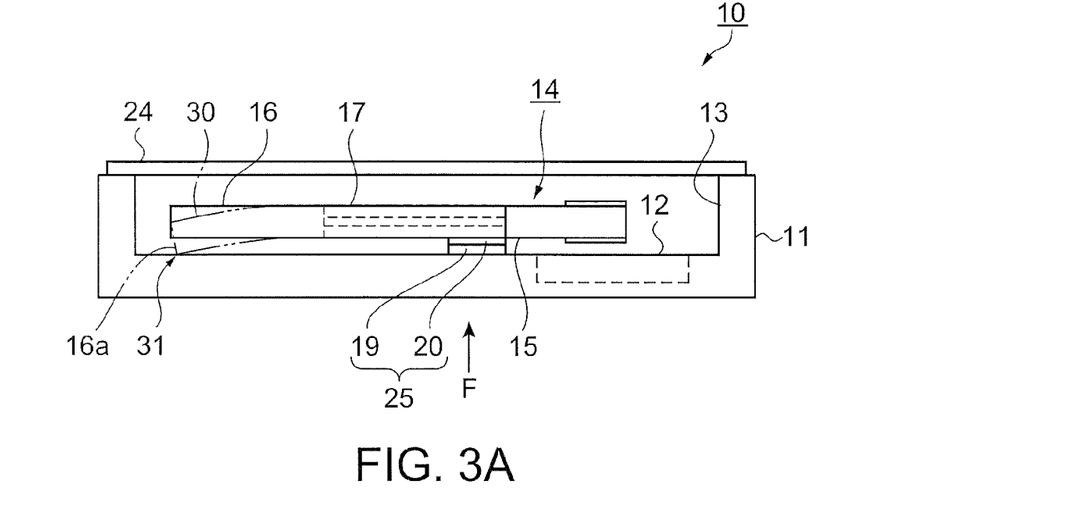
FIGS. 3A and 3B show a state of modification of a quartz oscillating resonator element and a cross section seen form the line A-A' in FIG. 2.
Figure 3B:
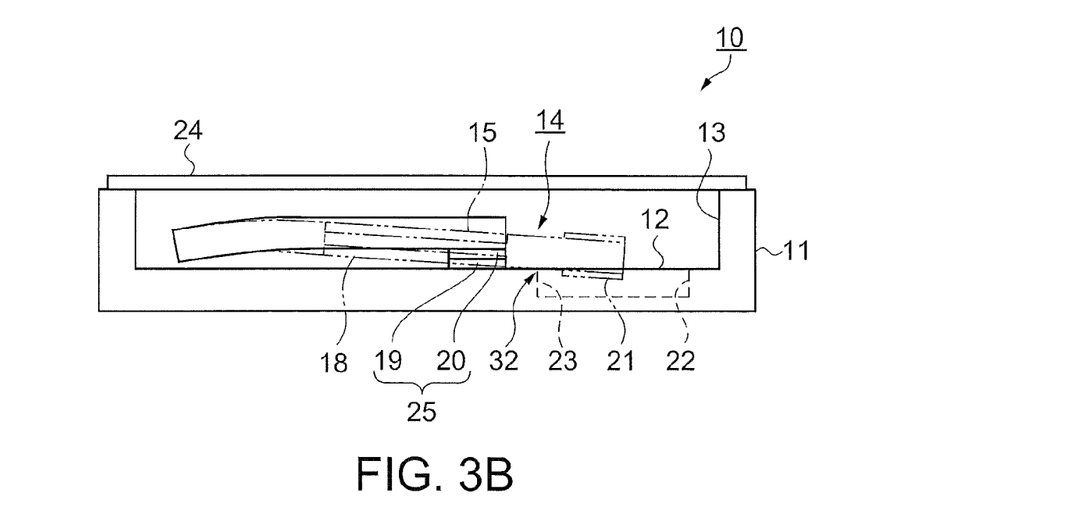

Here, deformation of the quartz resonator element 14 when a shock such as falling down is applied to the above quartz resonator 10 will be explained along with FIGS. 3A and 3B. FIGS. 3A and B are cross sectional views along the line A-A' in FIG. 2. As shown in FIG. 3A, if the quartz resonator 10 receives a impact force form the direction indicated as the arrow F, the quartz resonator element 14 is deformed toward the base 16 indicated as a two dots line while the connecting point 25 is a fulcrum, making a corner 31 of a base end 16a contact with the bottom surface 12 of the containable recess 13. This deformation is caused by positioning of the connecting portion 25 arranged at the end side of the supporting arms 17 from the gravitational center G of the quartz resonator element (see Fig.) First, the base side 16 to be easily deformed is deformed toward the bottom surface 12. Next, as shown in FIG. 3B, the end of the oscillating arms 15 in the quartz resonator element 14 is deformed toward the bottom surface 12, indicated as a two dots line. Then, the end portion including the end weight layer 21 of the oscillating arms 15 gets into the bottom recess 22 and contacts with the contact edge 23 at the position of the contact portion 32 between the groove 18 and the end weight layer 21.

In the quartz resonator element 14, the strength of a part in which the groove 18 is installed is the weakest among all portions of the long and thin oscillating arms 15. But, first, the base 16, which is far from the weakest portion as the groove 18 of the oscillating arms 15, receives a shock. Accordingly, this structure relaxes the strongest shock. Next, the oscillating arms 15 contact with the contact edge 23 of the bottom recess 22. But, the arms 15 are hardly damaged since a part in which the groove 18 is formed does not contact with the contact edge 23. Further, the contact portion 32 is away from the end weight layer 21, avoiding a crack and deformation of the weight layer 21 and avoiding a large frequency change and deterioration of oscillation characteristics. Further, the contact portion 32 is near to the fulcrum for deformation compared to the end of the oscillating arms 15, making a rotational momentum for deformation small. This small momentum reduces an impact at the time of contacting since the contact portion 32 contacts with the edge instead of the contact of the end of the oscillating arms 15. This structure can reduce the damage of the oscillating arms 15.

Here, in the embodiment, the thickness of the connecting pad 19, namely the space between the quartz resonator element 14 and the bottom surface 14 is called as "mounting height" hereafter. This mounting height is around 30 μm. If the mounting height is too high, the quartz resonator element 14 is easily damaged when a shock is applied to it from the outside since the amount of bending of the quartz resonator element 14 is too large due to the long distance of contacting of the bent quartz resonator element 14 with the bottom surface 12. On the other hand, if the mounting height is too low, the quartz resonator element 14 is also easily damaged when a shock is applied to it from the outside since the impact is large at the time of contacting the quartz resonator element 14 with the bottom surface 12 due to the short distance of contacting of the bent quartz resonator element 14 with the bottom surface 12.

Figure 4:
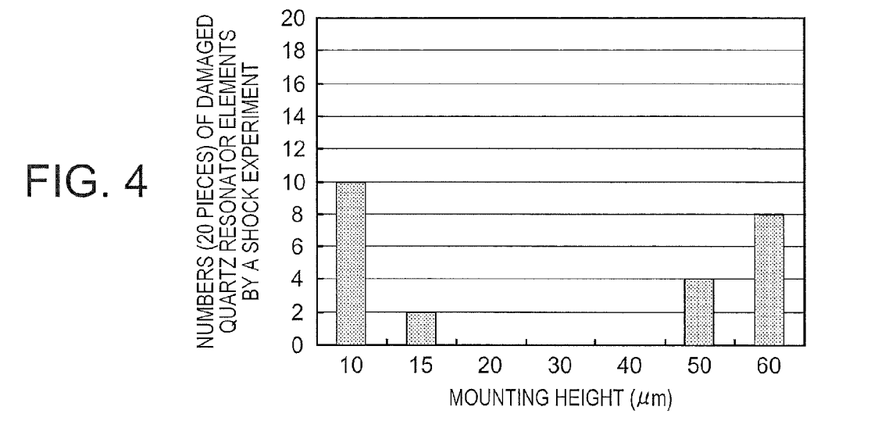
FIG. 4 is a graph showing a relationship between the mount height and the numbers of damaged quartz resonator elements by a shockproof experiment.

The inventors performed the experiment to confirm a relationship between the mounting height and the shockproof ability of the quartz resonator element 14 and found that the range of 20 μm to 40 μm is preferable for the mounting height. The experimental result is shown in FIG. 4. FIG. 4 shows the relationship between the mounting height and the shockproof ability of the quartz resonator element 14. There is no damage of the quartz resonator element 14 in the range of the mounting height 20 μm to 40 μm, but it was damaged outside the range.

Further, the length L1 of the connecting portion 25 shown in FIG. 2A may preferably be within the range of 30% to 50% of the length L2 of the supporting arms 17. In the embodiment, the length L1 of the connecting portion 25 is 0.4 mm and the length L2 of the supporting arms 17 is 1.0 mm. The ratio of L1 to L2 is 40%. Detail of it will be explained.

Figure 5:
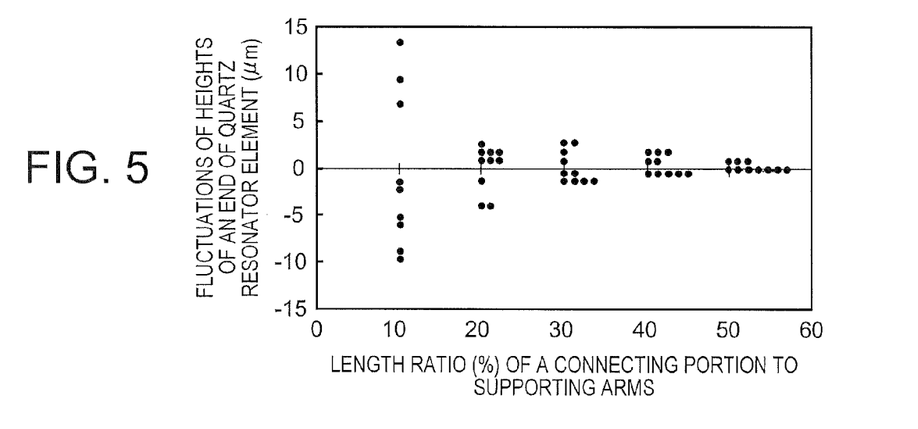
FIG. 5 is a graph showing a relationship between the length ratio of a connecting portion and fluctuations of heights of a quartz resonator element.

If the ratio of the length L1 of the connecting portion 25 to the length L2 of the supporting arms 17 (called as the ratio hereafter) is under 30%, namely the length L1 is short, the stance of the quartz resonator element 14 toward the vertical direction easily fluctuates at the time when the supporting arms 17 are mounted on the connecting pad 19. FIG. 5 shows the relationship between the ratio and fluctuation of the heights of the quartz resonator element 14.

Figure 6:
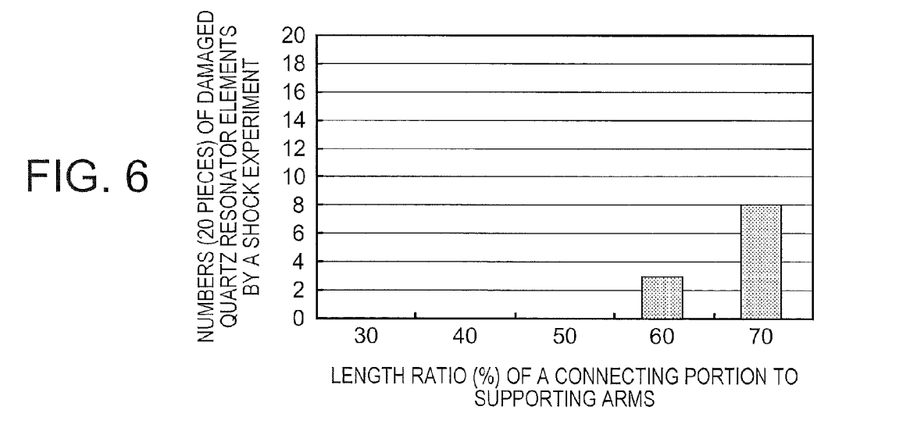
FIG. 6 is a graph showing a relationship between the length ratio of a connecting portion and the numbers of a damaged quartz resonator element when a shock is applied.

As shown in FIG. 5, the fluctuation of the heights of the quartz resonator element 14 is extremely high if the ratio is under 20%. The fluctuation of the stances of the quartz resonator element 14 may deteriorate oscillation characteristics of the quartz resonator element 14. If the ratio is over 50%, namely the length L1 of the connecting portion 25 is long, the supporting arms 17 is hardly deformed when a shock is applied to it and the stress due to such shock is easily concentrated around the portion crossing between the supporting arm 17 and the base 16. This stress concentration may damage the quartz resonator element 14. FIG. 6 shows the relationship between the ratio and numbers of the damaged quartz resonator elements 14. As shown in FIG. 6, damages of the quartz resonator elements 14 begin when the ratio is over 50% to 60%. Hence, the ratio controlled as 30% to 50% can constrain fluctuation of the oscillating characteristics of the quartz resonator 10, reducing the numbers of the damaged quartz resonator elements 14 due to a shock such as falling down.

As described above, the embodiment can reduce the damage of the quartz resonator element 14 in the quart oscillator 10 since a force applied to the groove 18 having the weak strength in the oscillating arms 15 can be reduced even when a shock such as falling down is applied to the quart resonator 10. Further, the embodiment can avoid deterioration of an oscillation characteristic due to deformation of the end weight layer 21 since the end weight layer 21 does not contact with the bottom surface 12 of the containable recess 13. Accordingly, the embodiment can provide the quartz resonator 10 in which shockproof ability of an oscillation characteristic is fairly improved.

Here, the connecting portion 25 is singularly installed for each of the supporting arms 17 in the embodiment. But, a plurality of portions in each of the supporting arms 17 may be connected to the base if such connecting portions are placed at the end side off from the gravitational center G of the quartz resonator element 14.

Figure 7:
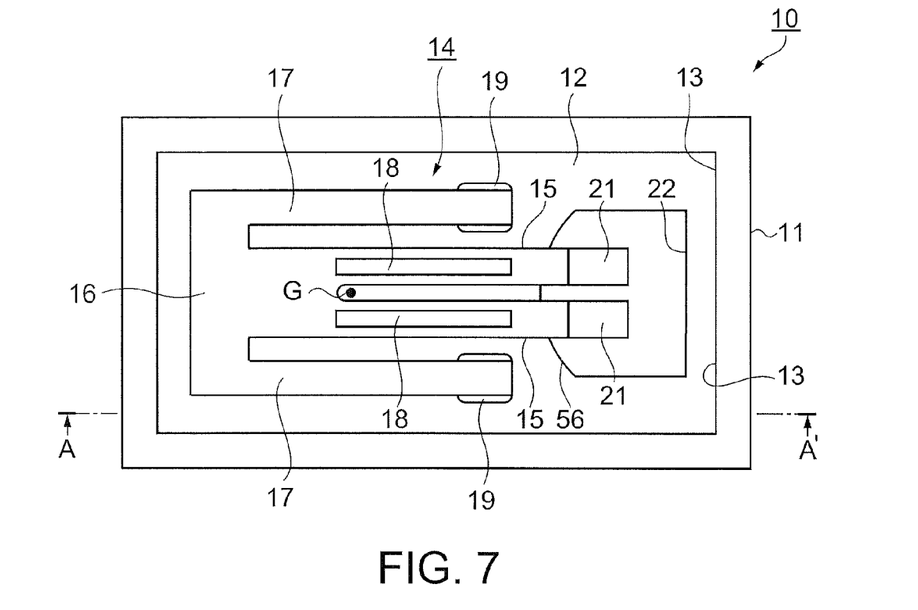
FIG. 7 is a plain view of an example of a configuration of a bottom recess.

Further, the shape of the bottom recess 22 is a square in the embodiment, but not limited to this. It is enough that the bottom recess 22 passes through the region of the bottom surface 12 opposing a part of the oscillating arms 15 located between the groove 18 formed in the oscillating arms 15 of the quartz resonator element 14 connected to the connecting pad 19 and the end weight layer, and the bottom recess is rimmed so that the region opposing a part of the oscillating arms 15 including the end weight layer 21 is placed inside of the edge. For example, the recess may have a configuration shown in FIG. 7. FIG. 7 is a plain view of an example of a configuration of the bottom recess 22. As sown in FIG. 7, the bottom recess 22 includes a contact edge 56 having an arc within a region of the bottom surface 12 opposing a part of the oscillating arms 15 located between the groove 18 formed in the oscillating arms 15 of the quartz resonator element 14 connected to the connecting pad 19 and the end weight layer 21. Further, the contact edge 56 is extended so as to rim the bottom recess 22, making the region opposing a part of the oscillating arms 15 including the end weight layer 21 placed inside of the edge.

Figure 8:
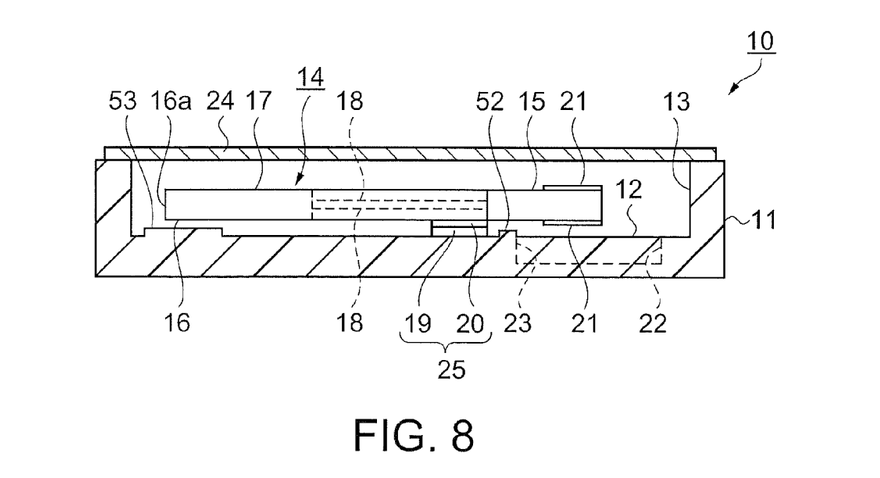
FIG. 8 is a cross sectional view explaining a receiving portion of a protrusion formed at the bottom surface of a contained recess.

Further, as shown in FIG. 8, which is a cross section of the quartz resonator 10, a receiving part 52 having a protrusion may be installed in a region of the bottom surface 12 of the containable recess 13 opposing a part of the oscillating arms 15 between the groove 18 and the end weight layer 21. Similarly, a receiving part 53 having a protrusion may be installed in the region of the bottom surface 12 of the containable recess 13 opposing the base 16 including an end of the base 16a. Here, either one of receiving parts 52 and 53 may be installed. Shapes of receiving parts 52 and 53 are not limited to a protrusion integrally formed with the bottom surface 12 shown in FIG. 8, but may be a pillow member attached to the bottom.

In this structure, the height of the receiving part 52 at the side of the oscillating arms 15 from the bottom surface 12 may be different from the height of the receiving part 53 at the side of the base 16, differentiating the space dimension between the receiving part 52 and the oscillating arms 15 from the space dimension between the receiving part 53 and the base 16. Such differentiated dimensions can further reduce damage even when either of the oscillating arms 15 and the base 16 contacts with one of receiving parts 52 and 53. Further, two separated contacts are occurred at different time, dispersing a shock due to contacts, avoiding the damage of the quartz resonator element 14.

Figure 9A:
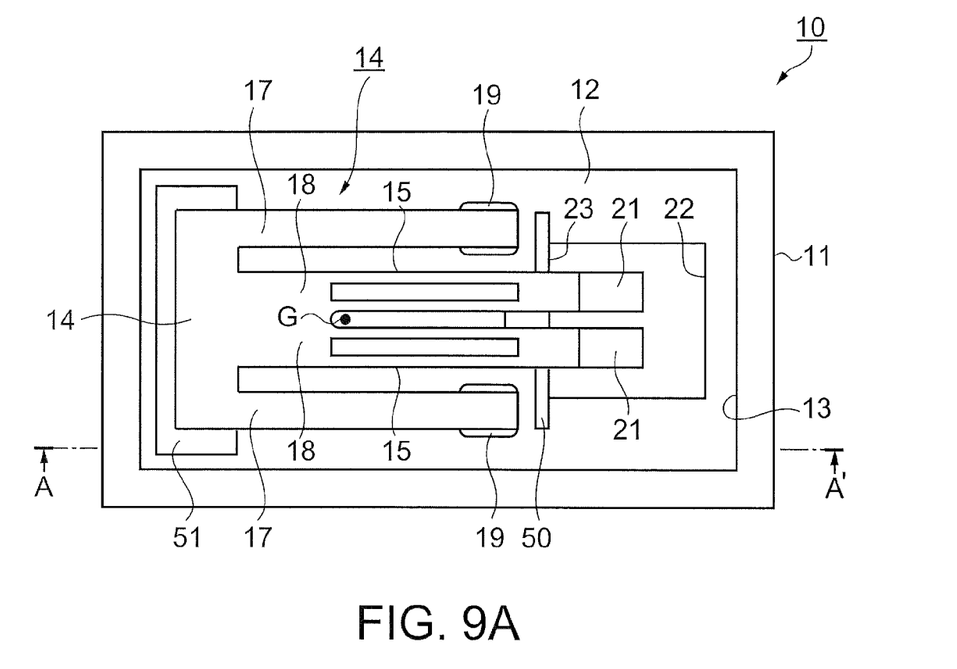
FIG. 9A is a plain view of a buffer at the bottom of a containable recess and FIG. 9B is a cross sectional view of it.
Figure 9B:
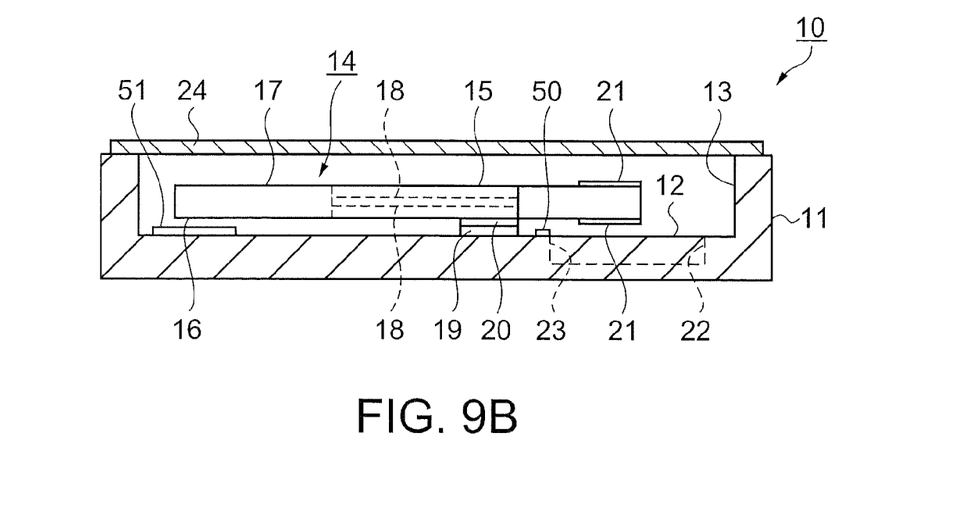

Further, as shown in the plain view of FIG. 9A and the cross section of FIG. 9 B, a buffer 50 may be formed in a region within the bottom surface 12 of the containable recess 13, opposing a part of the oscillating arms 15 between the groove 18 and the end weight layer 21. Similarly, a buffer 51 having a protrusion may be installed in the region of the bottom surface 12 of the containable recess 13 opposing the base 16 including an end of the base 16a. Here, either one of buffers 50 and 51 may be installed.

Buffers 50 and 51 are made of material such as softened metal or soften resin, which is able to relax an impact when the oscillating arms 15 or the base 16 contacts. For example, buffers comprise triple layers made of tungsten (W) as a bottom layer of which the thickness 5 μm to 15 μm, nickel (Ni) of which the thickness 1 μm to 9 μm and gold (Au) as a top layer of which the thickness 0.3 μm to 1 μm formed by metalization. Otherwise, silver (Ag) may be used instead of gold. Either one of the above triple layers may be used. Further, buffers may be made of resin layer(s) such as a silicone resin.

The buffers 50 and 51 formed on the bottom surface 12 of the containable recess 13 relax a shock due to a contact of the base 16 and/or oscillating arms 15 with the bottom surface 12, avoiding deformation of the quartz resonator element 14 and a damage of a contact part when a shock is applied.

Here, buffers 50 and 51 may be formed on the upper surfaces of receiving parts 52 and 53 shown in FIG. 8.

Figure 10:
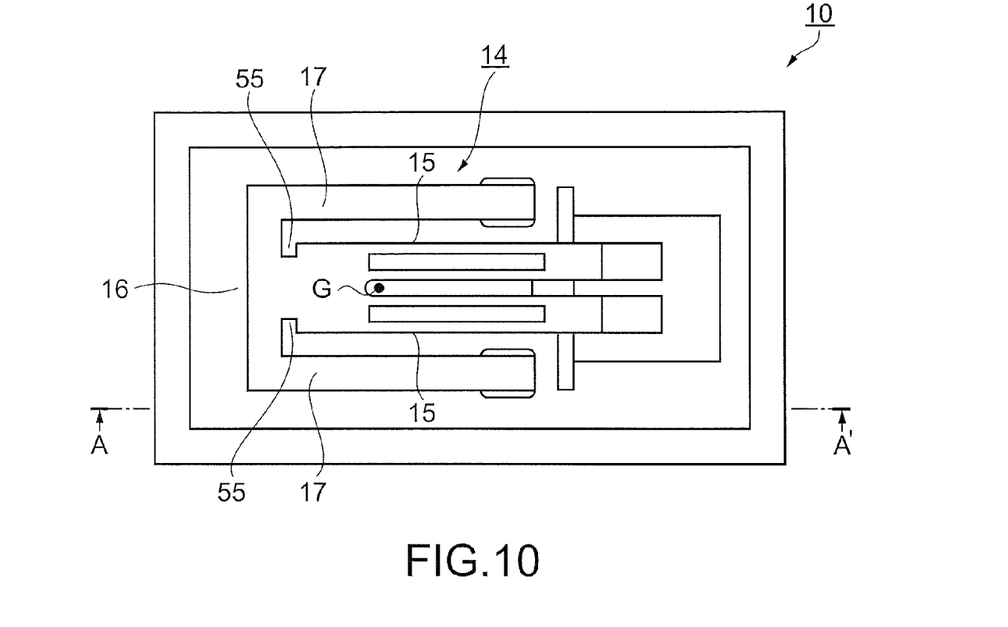
FIG. 10 is a plain view of an application example of a quartz resonator element.

FIG. 10 is a plain view of an application example of a quartz resonator. As shown in FIG. 10, a notch 55 directing toward the inside of the base 16 may be formed in the quartz resonator element 14 of the quartz resonator 10. The above mentioned the quartz resonator 10 is capable of absorbing a shock such as falling down, making use of the notch 55 which easily concentrates stresses. This notch 55 can avoid a leakage of oscillation energy of the oscillating arms 15, which transfers from the base 16 to the supporting arms 17, improving and stabilizing oscillation characteristics. Using the quartz resonator element 14 including the notch 55 for the above mentioned quartz resonator 10 provides the quartz resonator 10 which can avoid deterioration of a oscillating characteristic due to an oscillation leakage in addition to improving the a shockproof ability.

The entire disclosure of Japanese Patent Application No. 2006-301225, filed Nov. 7, 2006 is expressly incorporated by reference herein.

What is claimed is:

1. A piezoelectric device comprising:
a piezoelectric resonator element having
a base,
a plurality of oscillating arms paralleled each other and extended from the base,
a plurality of supporting arms extended from the base the side surface of each of the plurality of oscillating arms so as to sandwich the plurality of oscillating arms,
a groove formed in at least one of a front surface and a back surface of each of the plurality of oscillating arms and
an end weight layer formed in at least one of the front surface and the back surface near to an end portion of each of the plurality of oscillating arms;
a package storing the piezoelectric resonator element within a containable recess and being air-tightly sealed by a lid;
a bottom surface recess rimmed in the bottom surface of the containable recess; and
a connecting pad formed as a protrusion in an region that is connected with the plurality of supporting arms in the bottom surface of the containable recess, wherein
a part of the plurality of supporting arms is connected to the connecting pad via a joint portion, wherein
the bottom surface recess includes an edge in a region of the bottom surface of the containable recess opposing a part of the plurality of oscillating arms between the groove and the end weight layer, and the edge rims the bottom surface recess so as to allocate a part of the bottom surface of the containable recess opposing the end weight layer inside of the edge.

2. The piezoelectric device according to claim 1, wherein: compared with the gravitational center of the piezoelectric resonator element, the connecting portion is placed closer to the end side of the oscillating arms.

3. The piezoelectric device according to claim 1, wherein compared with the end weight layer of the piezoelectric resonator element, the connecting portion is placed closer to the base side.

4. The piezoelectric device according to claim 1, wherein the connecting portion is allocated within a region which is 30% or more and 50% or less of the length of the supporting arms from the end of the base opposing to the side where the oscillating arms are extended.

5. The piezoelectric device according to claim 1, wherein the connecting portion is made of a softened conductive adhesive.

6. The piezoelectric device according to claim 1, further comprising a buffer formed at least in a region within the bottom surface of the containable recess, opposing a part of the plurality of oscillating arms between the groove of and the end weight layer and/or at least a region opposing the base.

7. The piezoelectric device according to claim 1, wherein a dimension of a space between the bottom surface and the piezoelectric resonator element in the region opposing a part of the plurality of the oscillating arms between the groove and the end weight layer is different from a dimension of a space between the bottom surface and the piezoelectric resonator element in the region opposing the base.

8. The piezoelectric device according to claim 1, further comprising a notch formed so as to direct toward the inside of the base from the two outsides of the base.

\* \* \* \* \*